(12) United States Patent
Kunitake

(10) Patent No.: US 9,472,277 B2
(45) Date of Patent: Oct. 18, 2016

(54) NON-VOLATILE MEMORY DEVICE

(71) Applicant: Kabushiki Kaisha Toshiba, Minato-ku (JP)

(72) Inventor: Tetsuji Kunitake, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/183,732

(22) Filed: Feb. 19, 2014

(65) Prior Publication Data
US 2015/0117088 A1    Apr. 30, 2015

Related U.S. Application Data

(60) Provisional application No. 61/896,810, filed on Oct. 29, 2013.

(51) Int. Cl.
  *G11C 11/00*  (2006.01)
  *G11C 13/00*  (2006.01)
  *G11C 5/02*   (2006.01)

(52) U.S. Cl.
  CPC .......... *G11C 13/0069* (2013.01); *G11C 5/025* (2013.01); *G11C 13/0002* (2013.01); *G11C 13/0023* (2013.01); *G11C 2211/5641* (2013.01); *G11C 2213/77* (2013.01)

(58) Field of Classification Search
  CPC ...... G11C 11/00; G11C 5/02; G11C 13/0069
  USPC .................................................. 365/148, 51
  See application file for complete search history.

(56) References Cited

U.S. PATENT DOCUMENTS

| 8,064,272 | B2 | 11/2011 | Nagashima et al. |
| 8,339,833 | B2 | 12/2012 | Tokiwa et al. |
| 8,369,127 | B2 | 2/2013  | Maejima |

(Continued)

FOREIGN PATENT DOCUMENTS

| JP | 2009-230849 | 10/2009 |
| JP | 2010-192718 A | 9/2010 |

(Continued)

OTHER PUBLICATIONS

Natsuo Ajika, "Flash Memory, Recent Topics", Mitsubishi Electric Corporation, Semiconductor Group, 2000, vol. 69, No. 12, pp. 1462-1466 with English Abstract.

(Continued)

*Primary Examiner* — Son Mai
*Assistant Examiner* — Muna A Techane
(74) *Attorney, Agent, or Firm* — Oblon, McClelland, Maier & Neustadt, L.L.P.

(57) ABSTRACT

According to one embodiment, a non-volatile memory device includes: first memory cell regions including first wirings extending in a first direction, second wirings extending in a second direction crossing the first direction, and first memory cells provided between the first wirings and the second wirings and being capable of changing resistance state; and second memory cell regions including third wirings extending in the first direction, fourth wirings extending in the second direction crossing the first direction, and second memory cells provided between the third wirings and the fourth wirings and being capable of changing resistance state, the second memory cell region having a smaller area than the first memory cell region in top view.

18 Claims, 11 Drawing Sheets

(56) References Cited

U.S. PATENT DOCUMENTS

| | | | | |
|---|---|---|---|---|
| 2007/0121359 | A1* | 5/2007 | Kanda | G11C 16/24 365/51 |
| 2009/0073742 | A1* | 3/2009 | Katou | B82Y 10/00 365/148 |
| 2009/0262569 | A1* | 10/2009 | Shinozaki | H01L 27/24 365/148 |
| 2009/0307415 | A1* | 12/2009 | Kang | G11C 7/18 711/103 |
| 2010/0039861 | A1* | 2/2010 | Park | G11C 16/0483 365/185.11 |
| 2011/0134681 | A1 | 6/2011 | Nagashima et al. | |
| 2011/0316072 | A1* | 12/2011 | Lee | H01L 27/11551 257/329 |
| 2012/0033512 | A1 | 2/2012 | Takase | |
| 2012/0099367 | A1* | 4/2012 | Azuma | G11C 13/0007 365/148 |

FOREIGN PATENT DOCUMENTS

| JP | 2012-38371 A | 2/2012 |
|---|---|---|
| JP | 5039079 B2 | 10/2012 |

OTHER PUBLICATIONS

Shin'ichiro Kimura, Semiconductor Memory; DRAM, ULSI Research Department, Central Research Laboratory, 2000, vol. 69, No. 10, pp. 1233-1240 with English Abstract.

* cited by examiner

|     | second embodiment | third embodiment | |
|-----|-------------------|------------------|---|
|     |                   | main memory | sub memory |
| 2L  | MLC               | first write voltage | |
| 2S  | SLC               | second write voltage < first write voltage | |

FIG. 6

NON-VOLATILE MEMORY DEVICE

CROSS-REFERENCE TO RELATED APPLICATIONS

This application is based upon and claims the benefit of priority from U.S. Provisional Patent Application 61/896,810, filed on Oct. 29, 2013; the entire contents of which are incorporated herein by reference.

FIELD

Embodiments described herein relate generally to a non-volatile memory device.

BACKGROUND

Recently, a non-volatile memory device called ReRAM (resistance random access memory) has been developed. The memory element of ReRAM is based on a resistance change material. However, in this kind of memory, if a large memory cell array is arranged in the chip, the wiring arranged in the memory cell array is made longer. This increases the influence of the voltage drop of the wiring in the memory cell array.

In the case where a target memory cell and a non-target memory cell are connected to the same wiring, a large voltage drop may cause a malfunction in the non-target memory cell.

Conversely, if the memory cell array is made smaller, the extraction wiring and the control circuit region per memory cell array are made larger. This may decrease the degree of integration.

BRIEF DESCRIPTION OF THE DRAWINGS

FIG. 6 shows an exemplary recording scheme for writing to the memory cell regions according to the second embodiment and the third embodiment.

DETAILED DESCRIPTION

Figure 1:
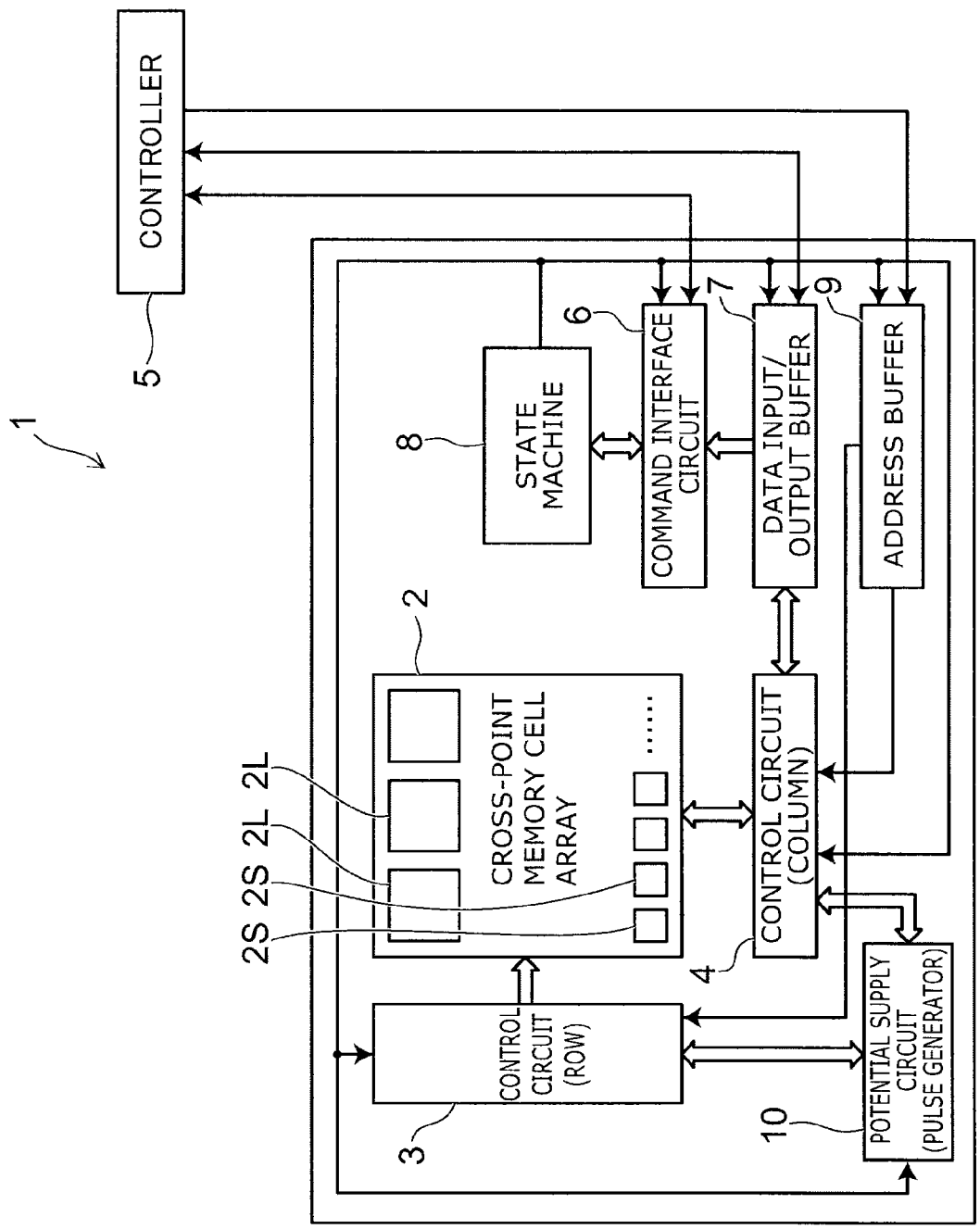
FIG. 1 is an exemplary schematic block diagram of a non-volatile memory device according to a first embodiment.

In general, according to one embodiment, a non-volatile memory device includes: first memory cell regions including first wirings extending in a first direction, second wirings extending in a second direction crossing the first direction, and first memory cells provided between the first wirings and the second wirings and being capable of changing resistance state; and second memory cell regions including third wirings extending in the first direction, fourth wirings extending in the second direction crossing the first direction, and second memory cells provided between the third wirings and the fourth wirings and being capable of changing resistance state, the second memory cell region having a smaller area than the first memory cell region in top view.

Embodiments will now be described with reference to the drawings. In the following description, like members are labeled with like reference numerals. The description of the members once described is omitted appropriately.

First Embodiment

FIG. 1 is an exemplary schematic block diagram of a non-volatile memory device according to a first embodiment.

The non-volatile memory device (resistance change memory) 1 includes e.g. a cross-point memory cell array 2.

The memory cell array 2 includes first memory cell regions 2L and second memory cell regions 2S. The first memory cell regions 2L and the second memory cell regions 2S are arranged in a matrix configuration, respectively.

Furthermore, the non-volatile memory device 1 includes a row control circuit 3 and a column control circuit 4. The row control circuit 3 selects a row (word line WL) of the memory cell array 2 based on e.g. a row address signal. The column control circuit 4 selects a column (bit line BL) of the memory cell array 2 based on e.g. a column address signal.

The row control circuit 3 and the column control circuit 4 control writing, erasure, and reading of data to/from the memory cell (memory element) in the memory cell array 2. For instance, the row control circuit 3 selects one of the word lines WL and applies a voltage for data erasure to the memory cell, data writing to the memory cell, and data reading from the memory cell to the one of the word lines WL. The column control circuit 4 selects one of the bit lines BL and applies a voltage required for data erasure of the memory cell, data writing to the memory cell, and data reading from the memory cell to the one of the bit lines BL.

In FIG. 1, the row control circuit 3 and the column control circuit 4 are shown beside the memory cell array 2. However, the row control circuit 3 and the column control circuit 4 do not need to be placed beside the memory cell array 2.

In the non-volatile memory device 1, for instance, writing is referred to as set operation, and erasure is referred to as reset operation. The resistance value of the set state only needs to be different from the resistance value of the reset state. The resistance value of the set state is higher or lower than the resistance value of the reset state.

For instance, it is assumed that the resistance value of the set state is lower than the resistance value of the reset state. The reset operation is defined as switching from the set state to the reset state. The set operation is defined as switching from the reset state to the set state.

The memory cell may store binary data (single-level data) so that the resistance value of the memory cell may change two levels. Alternatively, the non-volatile memory device 1 may be a multi-level resistance change memory in which one memory cell stores multi-level data.

A memory controller 5 (or host) sends a control signal and data to the non-volatile memory device 1. The control signal is inputted to a command interface circuit 6. The data is inputted to a data input/output buffer 7.

The command interface circuit 6 determines whether the data from the memory controller 5 is command data or not based on the control signal. In the case where the data is command data, the command interface circuit 6 transfers the data from the data input/output buffer 7 to a state machine 8.

The state machine 8 manages the operation of the non-volatile memory device 1 based on the command. For instance, the state machine 8 manages the set/reset operation and the read operation based on the command from the memory controller 5. The memory controller 5 can also receive the status information managed by the state machine 8 to determine the operation result in the non-volatile memory device 1.

In the set/reset operation and the read operation, the memory controller 5 supplies an address signal to the non-volatile memory device 1. The address signal is inputted to the row control circuit 3 and the column control circuit 4 through an address buffer 9.

A potential supply circuit 10 outputs, at a prescribed timing, e.g. a voltage pulse or current pulse for the set/reset operation and the read operation based on the command from the state machine 8. The potential supply circuit 10 includes a pulse generator. The potential supply circuit 10 controls the voltage/current value and the pulse width of the output voltage/current pulse depending on the operation indicated by the command and the control signal.

Figure 2:
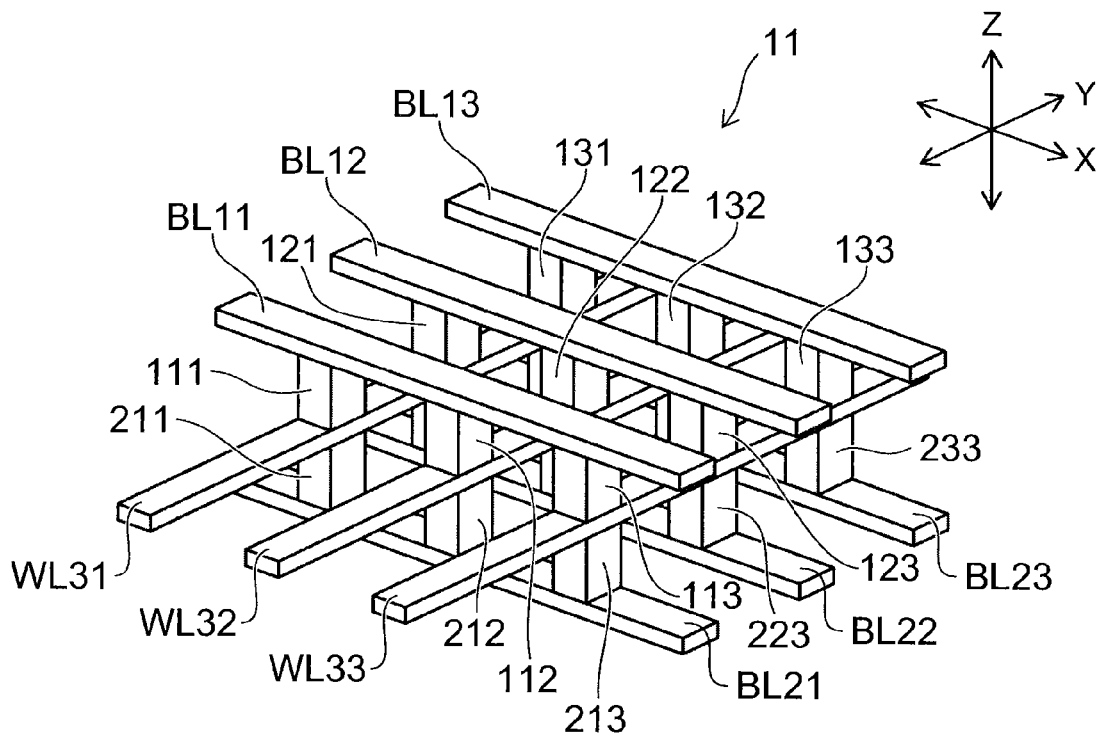
FIG. 2 is an exemplary schematic perspective view of part of a memory cell region included in a first memory cell region or a second memory cell region.

FIG. 2 is an exemplary schematic perspective view of part of the memory cell region included in the first memory cell region or the second memory cell region.

Here, the memory cell regions 2LM, 2SM (described later) may be configured in the same structure. Furthermore, the number of layers of the memory cell regions 2LM, 2SM may be made equal.

As an example, FIG. 2 shows a two-layer memory cell array. Here, the number of layers is not limited to two. The memory cell array may include three or more layers stacked in the Z-direction (third direction). A memory cell is provided at the cross point of the bit lines BL and the word lines WL. The memory cells are arranged in a matrix configuration in the X-direction (first direction) and the Y-direction (second direction). The bit line BL corresponds to the row line, and the word line WL corresponds to the column line.

For instance, a memory cell 111-133 is provided at the cross point of the bit lines BL11-13 and the word lines WL31-33. A memory cell 211-233 is provided at the cross point of the bit lines BL21-23 and the word lines WL31-33. The word lines WL31-33 are shared by the memory cells thereabove and therebelow.

Bit lines BL and word lines WL include a metal, having high heat resistance, and having a low resistance value. For instance, each bit line BL and each word line WL include e.g. tungsten (W), titanium (Ti), tantalum (Ta), and silicide thereof, or a stacked structure thereof.

Here, the difference between the memory cell region 2LM and the memory cell region 2SM lies in the number of memory cells in one layer. Here, the number of memory cells of the memory cell region 2LM in one layer is larger than the number of memory cells of the memory cell region 2SM in one layer. In other words, the length of the bit line BLL or the word line WLL arranged in the memory cell region 2LM is longer than the length of the bit line BLS or the word line WLS arranged in the memory cell region 2SM (see FIGS. 4A to 4C described later).

Figure 3:
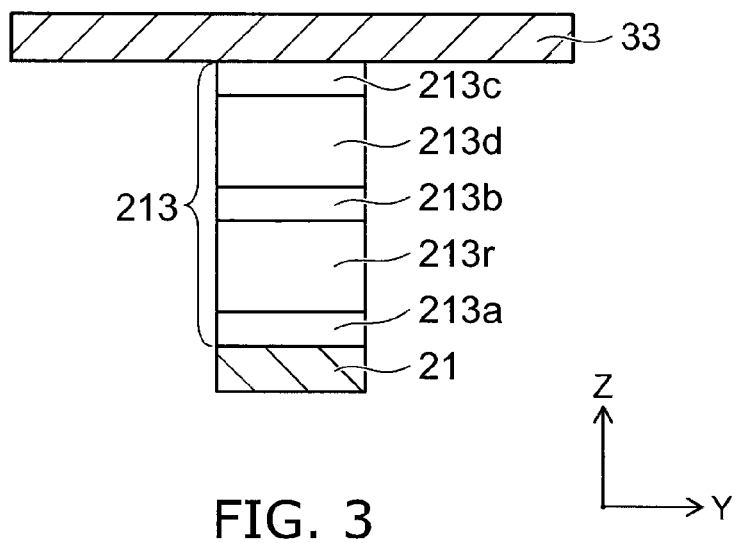
FIG. 3 is an exemplary schematic sectional view of the memory cell according to the first embodiment.

FIG. 3 is an exemplary schematic sectional view of the memory cell according to the first embodiment.

As an example, FIG. 3 illustrates the memory cell 213 in FIG. 2.

The memory cell 213 includes a series connected circuit of a variable resistance element 213r and a non-ohmic element 213d. The material of the variable resistance element 213r is selected to be a material whose resistance state can be changed through current, heat, chemical energy or the like by voltage application.

The material of the variable resistance element 213r is e.g. a material made of a composite compound including a transition element cation and having a resistance value changed by migration of the cation. Specifically, the material of the variable resistance element 213r can be a material represented by the chemical formula $A_xM_yX_z$ (A and M being different elements) and having a crystal structure such as the spinel structure ($AM_2O_4$), ilmenite structure ($AMO_3$), delafossite structure ($AMO_2$), $LiMoN_2$ structure ($AMN_2$), wolframite structure ($AMO_4$), olivine structure ($A_2MO_4$), hollandite structure ($A_xMO_2$), ramsdellite structure ($A_xMO_2$), and perovskite structure ($AMO_3$).

Electrodes 213a, 213b are provided above and below the variable resistance element 213r. Furthermore, an electrode 213c is provided between the word line WL33 and the non-ohmic element 213d. The electrode 213a, 213b, 213c functions as a barrier metal and an adhesive layer.

The material of the electrode 213a, 213b, 213c can be Pt, Au, Ag, TiAlN, SrRuO, Ru, RuN, Ir, Co, Ti, TiN, TaN, LaNiO, Al, $PtIrO_x$, $PtRhO_x$, Rh/TaAlN or the like. Furthermore, insertion of a metal film for making the orientation uniform is also possible. Furthermore, separate insertion of a buffer layer, a barrier metal layer, an adhesive layer and the like is also possible.

Alternatively, the material of the variable resistance element 213r can be e.g. polycrystalline or amorphous Si as a resistance change material, or SiO, SiN, SiON, Ge, SiGe, GaAs, InP, GaP, GaInAsP, GaN, SiC, HfSiO, HfO, AlO or the like. Alternatively, the resistance change material can be a stacked film of the aforementioned materials. The electrode 213a, 213b in the case of using such a resistance change material can be made of e.g. Ag, Au, Ti, Ni, Co, Al, Fe, Cr, Cu, W, Hf, Ta, Pt, Ru, Zr, or Ir, or a nitride or carbide thereof. Alternatively, the electrode can be made of polycrystalline silicon added with the aforementioned material. Furthermore, a stopper layer of TaSiN can also be inserted on the opposite side from the electrode of the resistance change material.

Figure 4A:
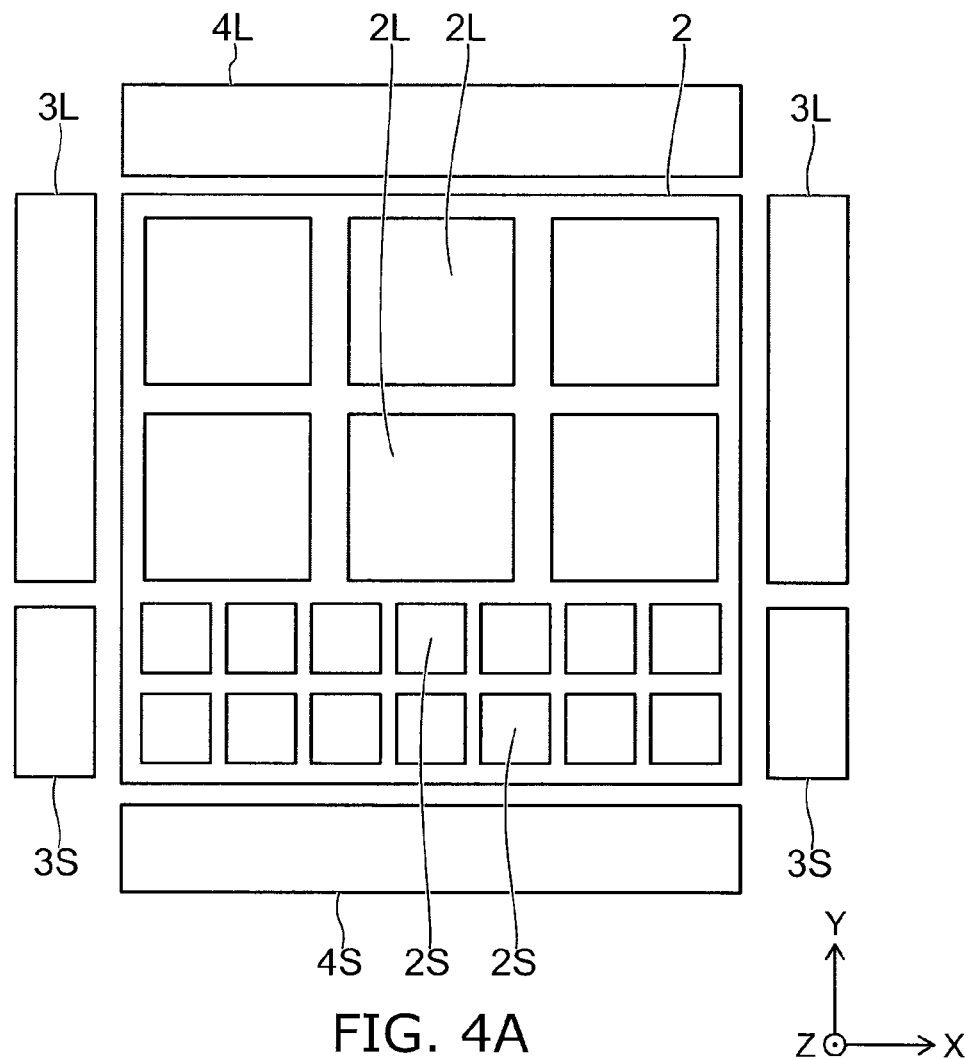
FIG. 4A is an exemplary schematic plan view of the memory cell array of the non-volatile memory device according to the first embodiment.
Figure 4B:
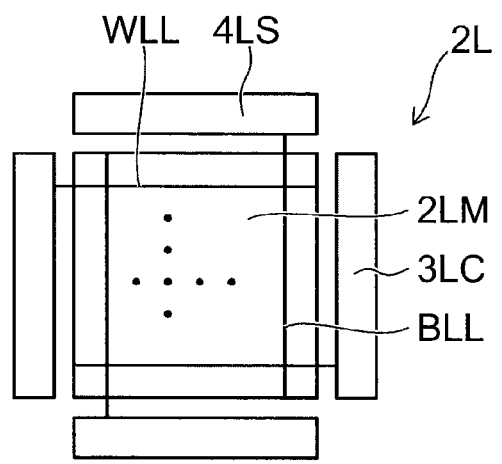
FIGS. 4B and 4C are exemplary enlarged plan views of the memory cell region.
Figure 4C:
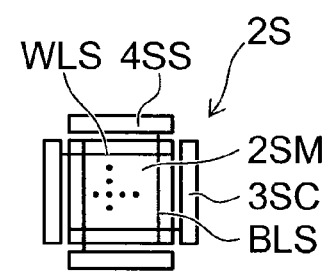

FIG. 4A is an exemplary schematic plan view of the memory cell array of the non-volatile memory device according to the first embodiment. FIGS. 4B and 4C are exemplary enlarged plan views of the memory cell region.

As shown in FIGS. 4A to 4C, the memory cell array 2 includes first memory cell regions 2L and second memory cell regions 2S. The first memory cell regions 2L are arranged in the X-direction and the Y-direction in the memory cell array 2. The second memory cell regions 2S are arranged in the X-direction and the Y-direction in the memory cell array 2. As viewed in the Z-direction, the planar area of one second memory cell region 2S is smaller than the planar area of one first memory cell region 2L. The first memory cell regions 2L and the second memory cell regions 2S constitute a memory cell array. The second memory cell regions 2S being adjacent constitute a group. This group is arranged in the edge portion of the memory cell array.

The first memory cell region 2L includes a memory cell region 2LM, a row decoder 3LC, and a column decoder 4LS. The row decoder 3LC is arranged adjacent in the X-direction to the memory cell region 2LM. The column decoder 4LS is arranged adjacent in the Y-direction to the memory cell region 2LM. For instance, a word line WLL extends from the row decoder 3LC arranged on one side to the edge portion on the other side of the memory cell region 2LM. A bit line BLL extends from the column decoder 4LS arranged on one side to the edge portion on the other side of the memory cell region 2LM.

The second memory cell region 2S includes a memory cell region 2SM, a row decoder 3SC, and a column decoder 4SS. The row decoder 3SC is arranged adjacent in the X-direction to the memory cell region 2SM. The column decoder 4SS is arranged adjacent in the Y-direction to the memory cell region 2SM. For instance, a word line WLS extends from the row decoder 3SC arranged on one side to the edge portion on the other side of the memory cell region 2SM. A bit line BLS extends from the column decoder 4SS arranged on one side to the edge portion on the other side of the memory cell region 2SM.

A control circuit 3L is arranged beside the first memory cell region 2L in the memory cell array 2 in the X-direction. A control circuit 3S is arranged beside the second memory cell region 2S in the memory cell array 2 in the X-direction.

A control circuit 4L is arranged beside the first memory cell region 2L in the memory cell array 2 in the Y-direction. A control circuit 4S is arranged beside the second memory cell region 2S in the memory cell array 2 in the Y-direction.

For instance, the row control circuit 3L and the column control circuit 4L control the first memory cell regions 2L. In the embodiment, the row control circuit 3L and the column control circuit 4L may be collectively referred to as first control circuit. On the other hand, the row control circuit 3S and the column control circuit 4S control the second memory cell regions 2S. In the embodiment, the row control circuit 3S and the column control circuit 4S are collectively referred to as second control circuit.

Here, the row control circuit 3L can select one or more word lines WLL from the word lines WLL by controlling the row decoder 3LC. The row control circuit 3S can select one or more word lines WLS from the word lines WLS by controlling the row decoder 3SC.

The column control circuit 4S can select one or more first memory cell regions 2L or second memory cell regions 2S from the first memory cell regions 2L or the second memory cell regions 2S. Furthermore, the column control circuit 4S controls the column decoder 4LS, 4SS of the selected first memory cell regions 2L or second memory cell regions 2S and transfers data to the bit lines BLL, BLS to write the data to the memory cells. Alternatively, the column control circuit 4S controls the column decoder 4LS, 4SS of the selected first memory cell regions 2L or second memory cell regions 2S and reads data from the memory cells through the bit lines BLL, BLS.

The row decoder 3LC, 3SC or the column decoder 4LS, 4SS can be arranged below the memory cell region 2LM, 2SM, respectively, in the Z-direction.

Thus, the area of the non-volatile memory device 1 is reduced. This can shrink the non-volatile memory device 1.

Figure 5A:
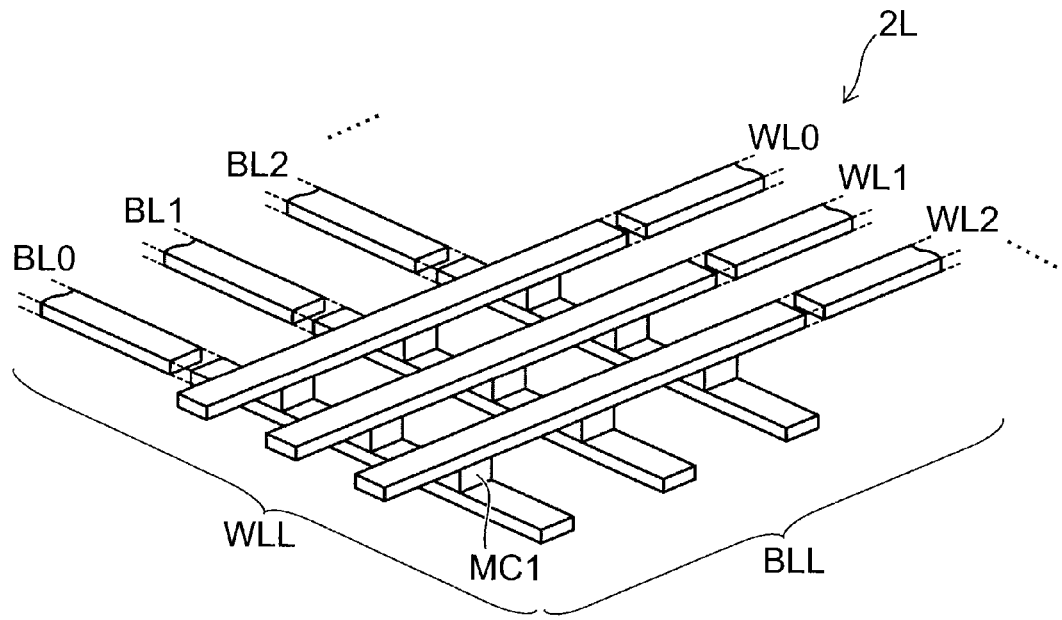
FIG. 5A is a schematic perspective view showing the first memory cell region of the memory cell array according to the first embodiment.
Figure 5B:
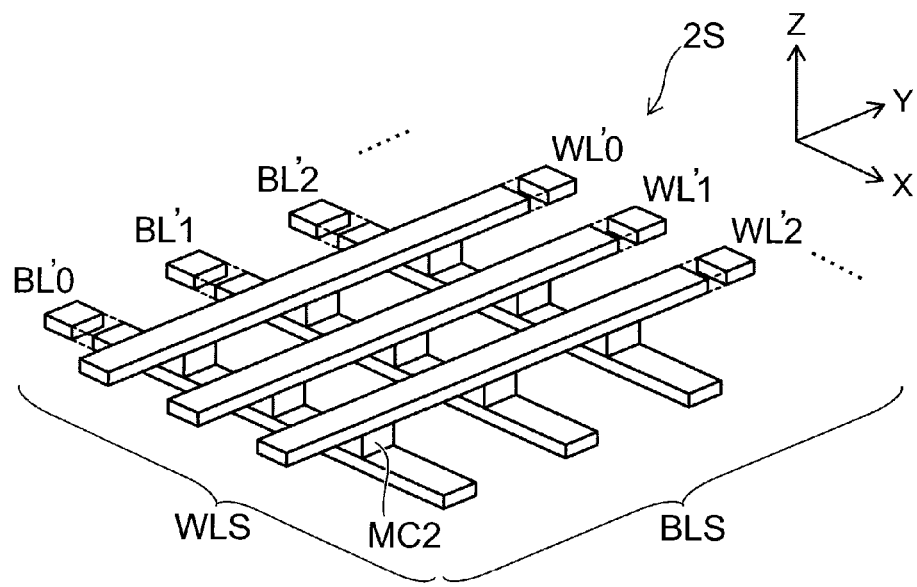
FIG. 5B is a schematic perspective view showing the second memory cell region of the memory cell array according to the first embodiment.

FIG. 5A is a schematic perspective view showing the first memory cell region of the memory cell array according to the first embodiment. FIG. 5B is a schematic perspective view showing the second memory cell region of the memory cell array according to the first embodiment. Here, as an example, FIGS. 5A and 5B show a one-layer memory cell array.

The number of memory cells included in the second memory cell region 2S is smaller than the number of memory cells included in the first memory cell region 2L. Thus, as shown in FIGS. 5A and 5B, the length WLS of the word line WL and the length of the bit line BLS in the second memory cell region 2S are shorter than the length WLL of the word line WL and the length BLL of the bit line in the first memory cell region 2L.

Accordingly, the voltage drop of the word line WL and the bit line BL is made smaller in the second memory cell region 2S. If the voltage drop is made larger, for instance, in the set/reset operation, a low voltage is applied to the memory cell located far from the control circuit, and a high voltage is applied to the memory cell located near to the control circuit. The voltage applied to the memory cell located far from the control circuit may be set to a reference voltage of the set/reset voltage. Then, the reference voltage is not applied to the memory cell located near to the control circuit. This may cause a malfunction of the set/reset operation.

In the first embodiment, second memory cell regions 2S having a small area are provided to suppress the voltage drop of the word line WL and the bit line BL. This structure can suppress a possibility of the malfunction. Furthermore, because the malfunction is suppressed, it is possible to reduce the number of the set/reset operation to the memory cell. Thus, the operation time of the non-volatile memory device is made shorter. Furthermore, suppression of the voltage drop reduces the power consumption.

Here, high-speed operation of a NAND flash memory, which is a kind of known non-volatile memory devices, is considered. The NAND flash memory includes a memory string in which memory cells are connected in series. The memory strings are connected to one bit line. Even if the number of memory cells connected in the memory string is halved, the operation time and the leakage current are not so reduced. This is because the number of memory strings connected to one bit line remains unchanged.

On the other hand, in the cross-point memory cell array shown in FIG. 2, the memory cells are each connected to one bit line. As a result, in the cross-point memory cell array, the operation time and the leakage current can be significantly reduced by decreasing the memory cells connected to one bit line.

Furthermore, in the first embodiment, the non-volatile memory device 1 includes the first memory cell regions 2L in addition to the second memory cell regions 2S. For instance, in the case of composing the memory cell array 2 only of the second memory cell regions 2S, the number of memory cells per unit area of the memory cell array 2 decreases. This is because the number of memory cells included in the second memory cell region 2S is small, and because an area of the wirings extracted from the second memory cell region 2S increases. This may result in decreasing the degree of integration of the memory cells of the non-volatile memory device. In the first embodiment, the second memory cell regions 2S are made coexistent with the first memory cell regions 2L having a larger area than the second memory cell regions 2S to suppress the decrease of the degree of integration of the memory cells.

Furthermore, a data latch circuit may be provided in each column decoder 4LS, 4SS. This enables data transfer from the second memory cell regions 2S to the first memory cell regions 2L, or data transfer from the first memory cell regions 2L to the second memory cell regions 2S, without the intermediary of the column control circuit 4L (multi-operation in the non-volatile memory device). Thus, the data transfer path is made shorter, and the operation time of the non-volatile memory device is reduced.

Furthermore, the second memory cell region 2S can also be used as e.g. a cache memory. For instance, the second memory cell region 2S allows operation for temporarily writing external data, and transferring the data to the first memory cell region 2L during the absence of external commands. In the second memory cell region 2S, a length of the bit line BLS and a length of the word line WLS are short. Thus, the second memory cell region 2S allows fast operation of writing and reading data. On the other hand, the first memory cell region 2L does not allow fast operation of writing and reading data, but includes a larger number of memory cells. As a result, external data can be written rapidly, and a large amount of data can be stored.

Second Embodiment

FIG. 6 shows an exemplary recording scheme for writing to the memory cell regions.

In the non-volatile memory device 1, the potential applied to the selected bit wiring by the first control circuit may be different from the potential applied to the selected bit line BL by the second control circuit. Furthermore, in the non-volatile memory device 1, the potential applied to the selected word wiring by the first control circuit may be different from the potential applied to the selected word line WL by the second control circuit.

For instance, in the second embodiment, as shown in FIG. 6, the first memory cell region 2L includes memory cells that can store multiple values (multi-level cells, MLC). The second memory cell region 2S includes memory cells that can store binary values (single-level cells, SLC). The first control circuit can perform writing in multiple values on the memory cells of the first memory cell region 2L. The second control circuit can perform writing in binary values on the memory cells of the second memory cell region 2S.

In the case where the memory cells of the first memory cell region 2L and the memory cells of the second memory cell region 2S are single-level cells, the memory capacity per unit area of the non-volatile memory device is determined by the number of memory cells.

In contrast, in the case where the memory cells of the first memory cell region 2L are multi-level cells, and the memory cells of the second memory cell region 2S are single-level cells, the memory capacity per unit area of the non-volatile memory device is increased by the increased amount of the memory capacity of the first memory cell region 2L.

Furthermore, in the case where the memory cells of the first memory cell region 2L and the memory cells of the second memory cell region 2S are multi-level cells, the possibility of malfunctions in the non-volatile memory device may be increased by the write operation in multiple values.

In contrast, in the case where the memory cells of the first memory cell region 2L are multi-level cells, and the memory cells of the second memory cell region 2S are single-level cells, the possibility of malfunction in the second memory cell region 2S is suppressed. Furthermore, because the possibility of malfunction is suppressed, it is possible to reduce the number of the set/reset operation to the memory cell. Thus, the operation time of the non-volatile memory device is made shorter.

Third Embodiment

In the non-volatile memory device 1, at the time of the write operation, the voltage applied to the memory cell of the second memory cell region 2S by the second control circuit may be lower than the voltage applied to the memory cell of the first memory cell region 2L by the first control circuit.

For instance, at the write operation, the first control circuit applies a first voltage to the selected bit line, and applies 0 V to the selected word line. On the other hand, at the write operation, the second control circuit applies a second voltage lower than the first voltage to the selected bit line, and applies 0 V to the selected word line.

Thus, the memory cell of the second memory cell region 2S (sub memory) as a cache memory is subjected to the write operation with a weaker electric field than the memory cell of the first memory cell region 2L (main memory) (see FIG. 6). Even if the data retention characteristic is degraded by writing with a weaker electric field, there is no problem because the second memory cell region 2S is used as a cache memory area. Furthermore, writing with a weaker electric field reduces the power consumption of the non-volatile memory device.

Fourth Embodiment

FIGS. 7 to 12 are exemplary schematic plan views of the memory cell array of the non-volatile memory device according to a fourth embodiment. FIGS. 7 to 12 each show alternative arrangement layouts of the memory cell array of the non-volatile memory device described above.

Here, the details of the first memory cell region 2L and the second memory cell region 2S arranged in the memory cell array 2 are as shown in FIGS. 4B and 4C.

Figure 7:
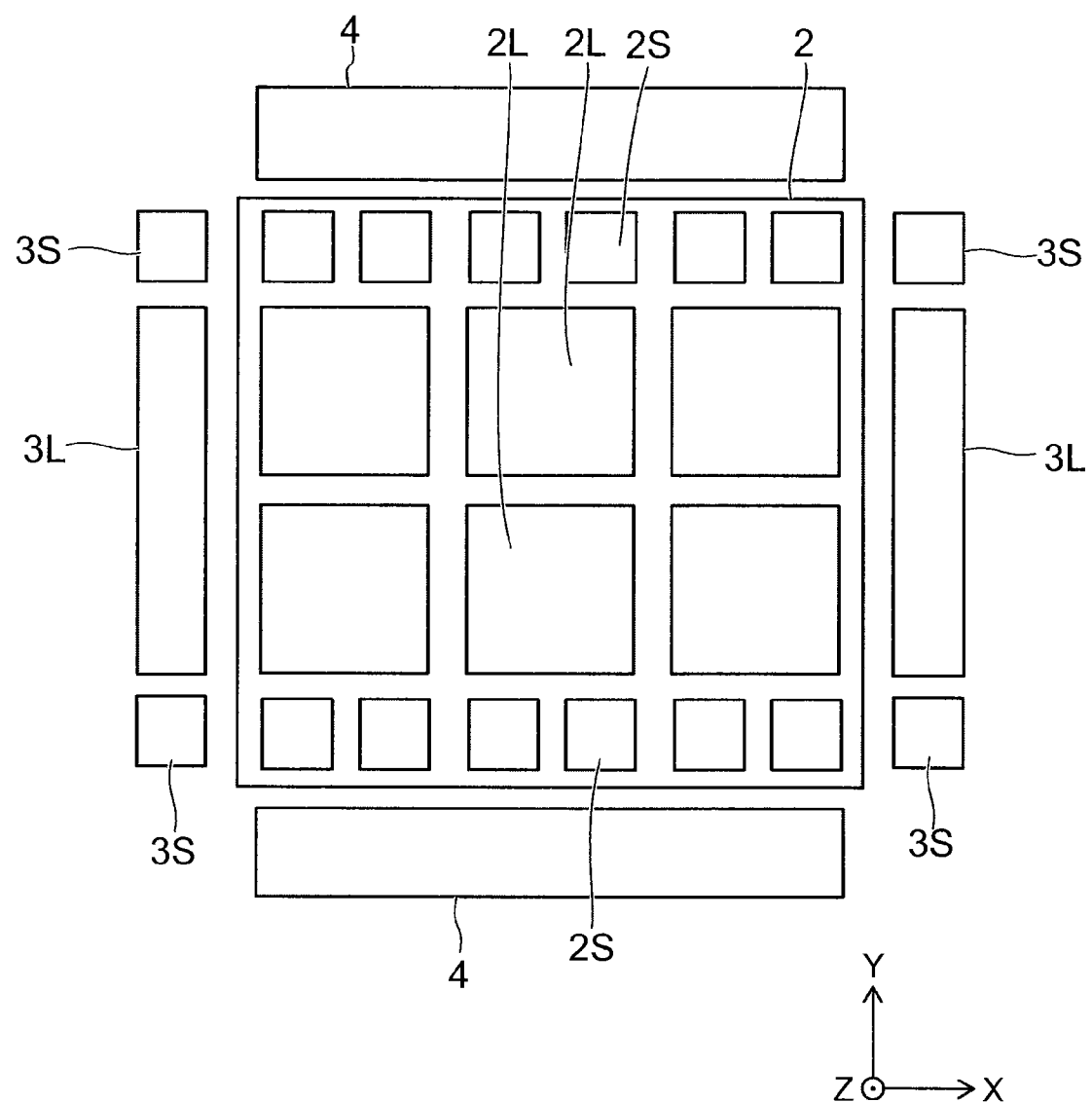
FIGS. 7 to 12 are exemplary schematic plan views of the memory cell array of the non-volatile memory device according to a fourth embodiment.

FIG. 7 shows a first arrangement example of the memory cell array of the non-volatile memory device according to the fourth embodiment.

In the Y-direction, the group of first memory cell regions 2L is sandwiched between the second memory cell regions 2S. Furthermore, in the Y-direction, the group of first memory cell regions 2L and the group of second memory cell regions 2S are sandwiched between the column control circuits 4. In the Y-direction, the group of second memory cell regions 2S is sandwiched between the group of first memory cell regions 2L and the column control circuit 4.

In the first arrangement example, the first memory cell regions 2L and the second memory cell regions 2S constitute a memory cell array. The control circuits 3L, 3S are arranged on both edges of this memory cell array. For instance, in the X-direction, a row control circuit 3L is arranged beside the group of first memory cell regions 2L. In the X-direction, a row control circuit 3S is arranged beside the group of second memory cell regions 2S. Here, second memory cell regions 2S being adjacent constitute a group. This group is arranged in the edge portion in the Y-direction of the memory cell array 2.

In the first arrangement example, the second memory cell regions 2S are arranged close to the column control circuit 4. Furthermore, the column control circuit 4 controls both the first memory cell regions 2L and the second memory cell regions 2S. In other words, the column control circuit 4 is shared to control the first memory cell regions 2L and the second memory cell regions 2S.

In the case of using the second memory cell regions 2S as a cache memory, the column control circuit 4 controls the column decoder 4SS and temporarily stores data in the second memory cell regions 2S. Next, the data temporarily stored in the second memory cell regions 2S is moved to the data latch circuit of the column decoder 4SS. Next, the data is transferred from the second memory cell regions 2S to the first memory cell regions 2L without the intermediary of the column control circuit 4. Alternatively, data can also be transferred from the first memory cell regions 2L to the second memory cell regions 2S.

In the first arrangement example, in the Y-direction, the group of first memory cell regions 2L is sandwiched between the groups of second memory cell regions 2S. Thus, the aforementioned operation can be performed from both the upper side and the lower side of FIG. 7. This realizes acceleration of data transfer.

Figure 8:
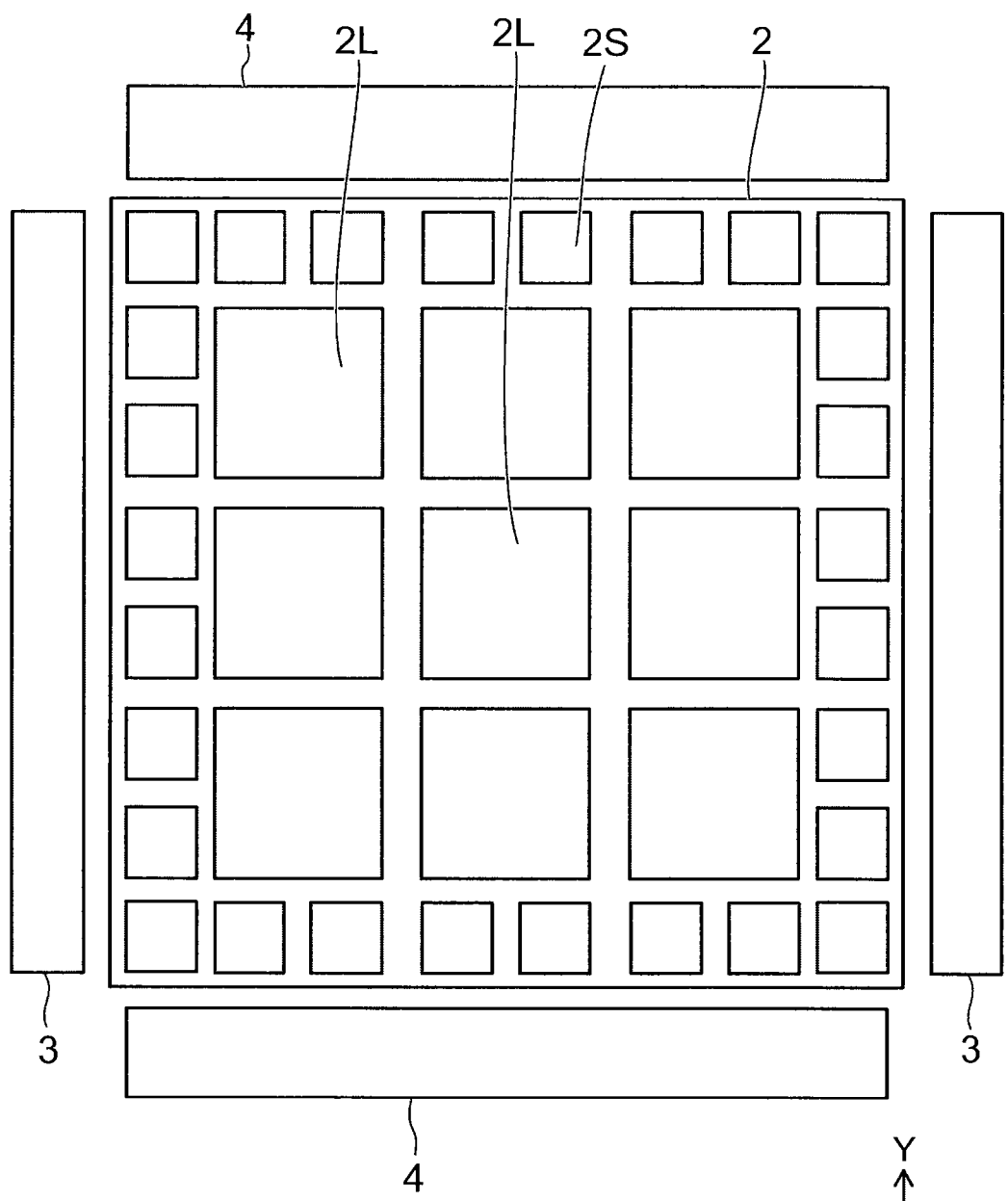

FIG. 8 shows a second arrangement example of the memory cell array of the non-volatile memory device according to the fourth embodiment.

In the second arrangement example, the group of first memory cell regions 2L arranged in the X-direction and the Y-direction is surrounded with the second memory cell regions 2S. Here, the first memory cell regions 2L being adjacent constitute a first group. This first group is surrounded with the second memory cell regions 2S. Here, the number of first memory cell regions 2L shown in FIG. 8 is larger than the number of first memory cell regions 2L shown in FIG. 4A.

For instance, in the X-direction, the group of first memory cell regions 2L is sandwiched between the groups of second memory cell regions 2S. Furthermore, in the Y-direction, the group of first memory cell regions 2L is sandwiched between the groups of second memory cell regions 2S. That is, in the X-direction and the Y-direction, the second memory cell regions 2S are arranged so as to surround the group of first memory cell regions 2L arranged around the central part of the memory cell array 2.

Here, in the Y-direction, the respective groups of first memory cell regions 2L and second memory cell regions 2S are sandwiched between the column control circuits 4. In the X-direction, the respective groups of first memory cell regions 2L and second memory cell regions 2S are sandwiched between the row control circuits 3. The column control circuit 4 controls both the first memory cell regions 2L and the second memory cell regions 2S. Furthermore, the row control circuit 3 controls both the first memory cell regions 2L and the second memory cell regions 2S. That is, the column control circuit 4 is shared to control the first memory cell regions 2L and the second memory cell regions 2S. The row control circuit 3 is shared to control the first memory cell regions 2L and the second memory cell regions 2S.

In the second arrangement example, in the X-direction and the Y-direction, the second memory cell regions 2S are arranged so as to surround the group of first memory cell regions 2L arranged around the central part of the memory cell array 2. This realizes acceleration of data access between the first memory cell region 2L and the second memory cell region 2S.

Figure 9:
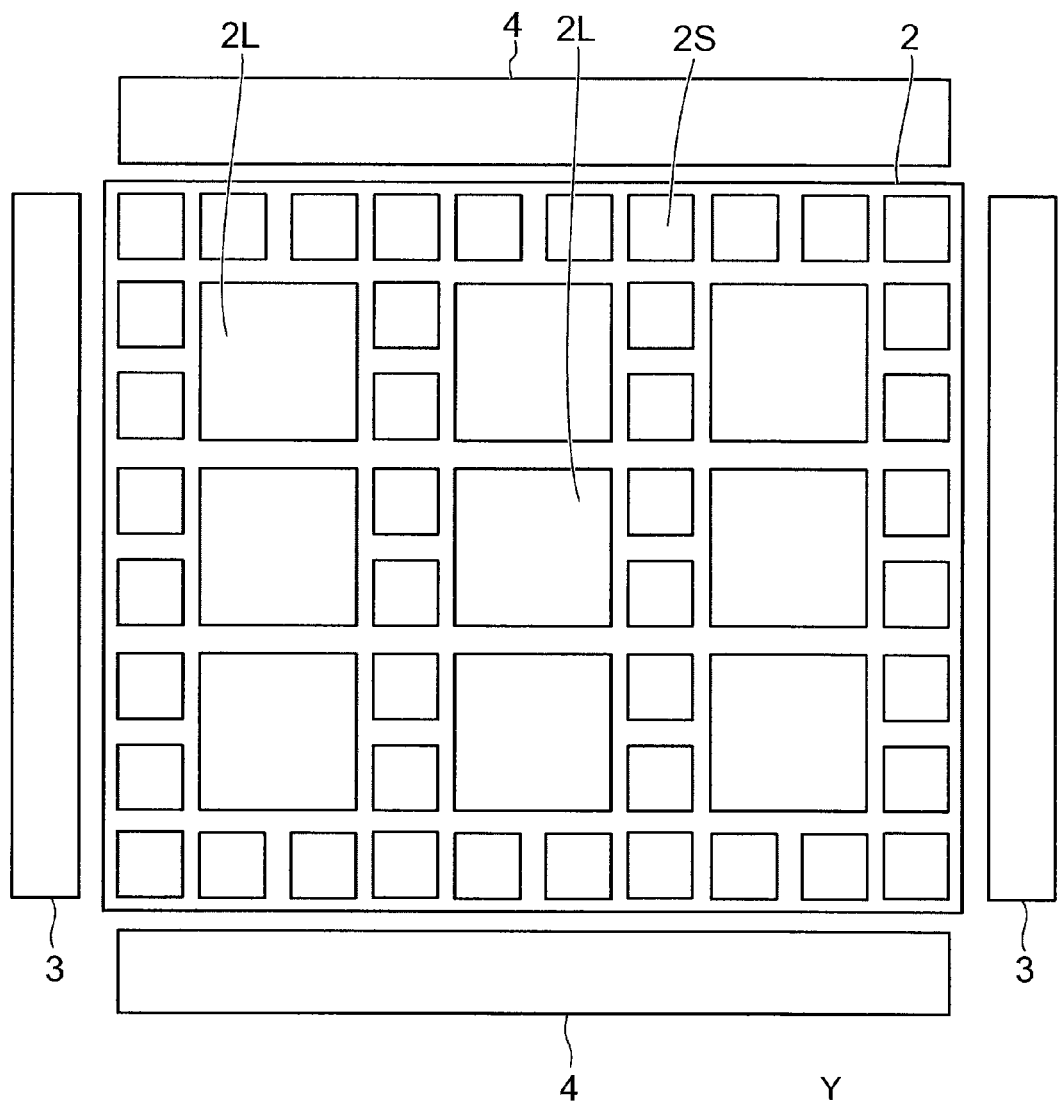

FIG. 9 shows a third arrangement example of the memory cell array of the non-volatile memory device according to the fourth embodiment.

In the third arrangement example, groups of first memory cell regions 2L are surrounded with the second memory cell regions. For instance, the groups of first memory cell regions 2L arranged in the X-direction and the Y-direction are surrounded with the second memory cell regions 2S.

In the third arrangement example, in the Y-direction, the groups of second memory cell regions 2S are arranged so as to penetrate between the column control circuits 4 opposed to each other. Furthermore, three or more of these groups of second memory cell regions 2S are arranged in the X-direction.

In the third arrangement example, for instance, the first memory cell regions 2L are divided into three groups in the X-direction. Each group of first memory cell regions 2L is surrounded with the second memory cell regions 2S. Thus, the second memory cell regions 2S are arranged adjacent in the X-direction also to the group of first memory cell regions 2L arranged in the central part of the memory cell array 2.

Here, in the Y-direction, the first memory cell regions 2L and the second memory cell regions 2S are sandwiched between the column control circuits 4. In the X-direction, the first memory cell regions 2L and the second memory cell regions 2S are sandwiched between the row control circuits 3. The column control circuit 4 controls both the first memory cell regions 2L and the second memory cell regions 2S. Furthermore, the row control circuit 3 controls both the first memory cell regions 2L and the second memory cell regions 2S. That is, the column control circuit 4 is shared to control the first memory cell regions 2L and the second memory cell regions 2S. The row control circuit 3 is shared to control the first memory cell regions 2L and the second memory cell regions 2S.

In the third arrangement example, in the X-direction and the Y-direction, the second memory cell regions 2S are arranged also near the group of first memory cell regions 2L around the central part of the memory cell array 2. It is possible to accelerate data access between the first memory cell region 2L and the second memory cell region 2S.

Figure 10:
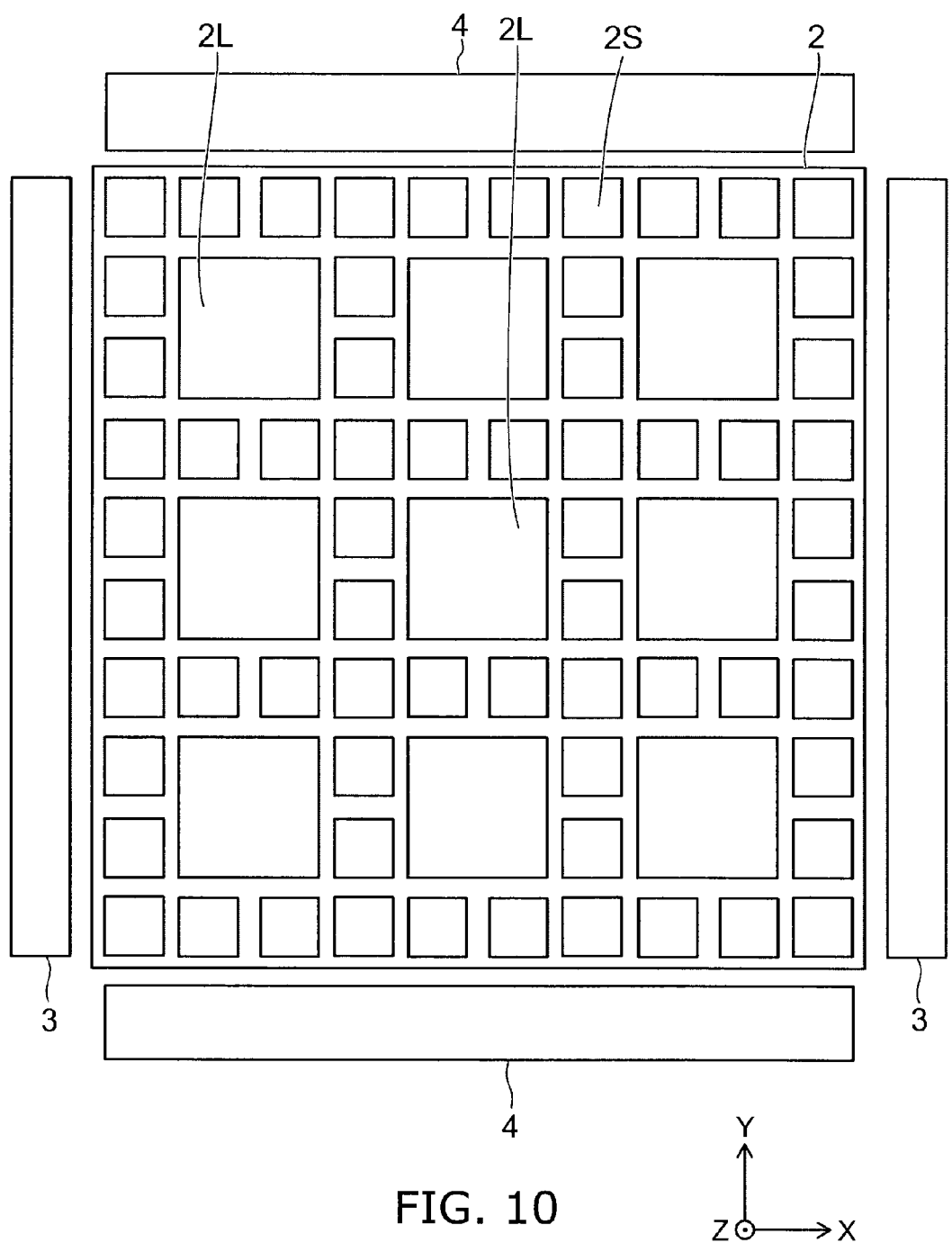

FIG. 10 shows a fourth arrangement example of the memory cell array of the non-volatile memory device according to the fourth embodiment.

FIG. 10 shows an arrangement example in which the arrangement example of FIG. 8 and the arrangement example of FIG. 9 are combined.

In the fourth arrangement example, each first memory cell region 2L is surrounded with the second memory cell regions 2S.

Here, in the Y-direction, the first memory cell regions 2L and the second memory cell regions 2S are sandwiched between the column control circuits 4. In the X-direction, the first memory cell regions 2L and the second memory cell regions 2S are sandwiched between the row control circuits 3. The column control circuit 4 controls both the first memory cell regions 2L and the second memory cell regions 2S. Furthermore, the row control circuit 3 controls both the first memory cell regions 2L and the second memory cell regions 2S. That is, the column control circuit 4 is shared to control the first memory cell regions 2L and the second memory cell regions 2S. The row control circuit 3 is shared to control the first memory cell regions 2L and the second memory cell regions 2S.

In the fourth arrangement example, each first memory cell region 2L is surrounded with the second memory cell regions 2S. It is possible to accelerate data access between the first memory cell region 2L and the second memory cell region 2S.

Figure 11:
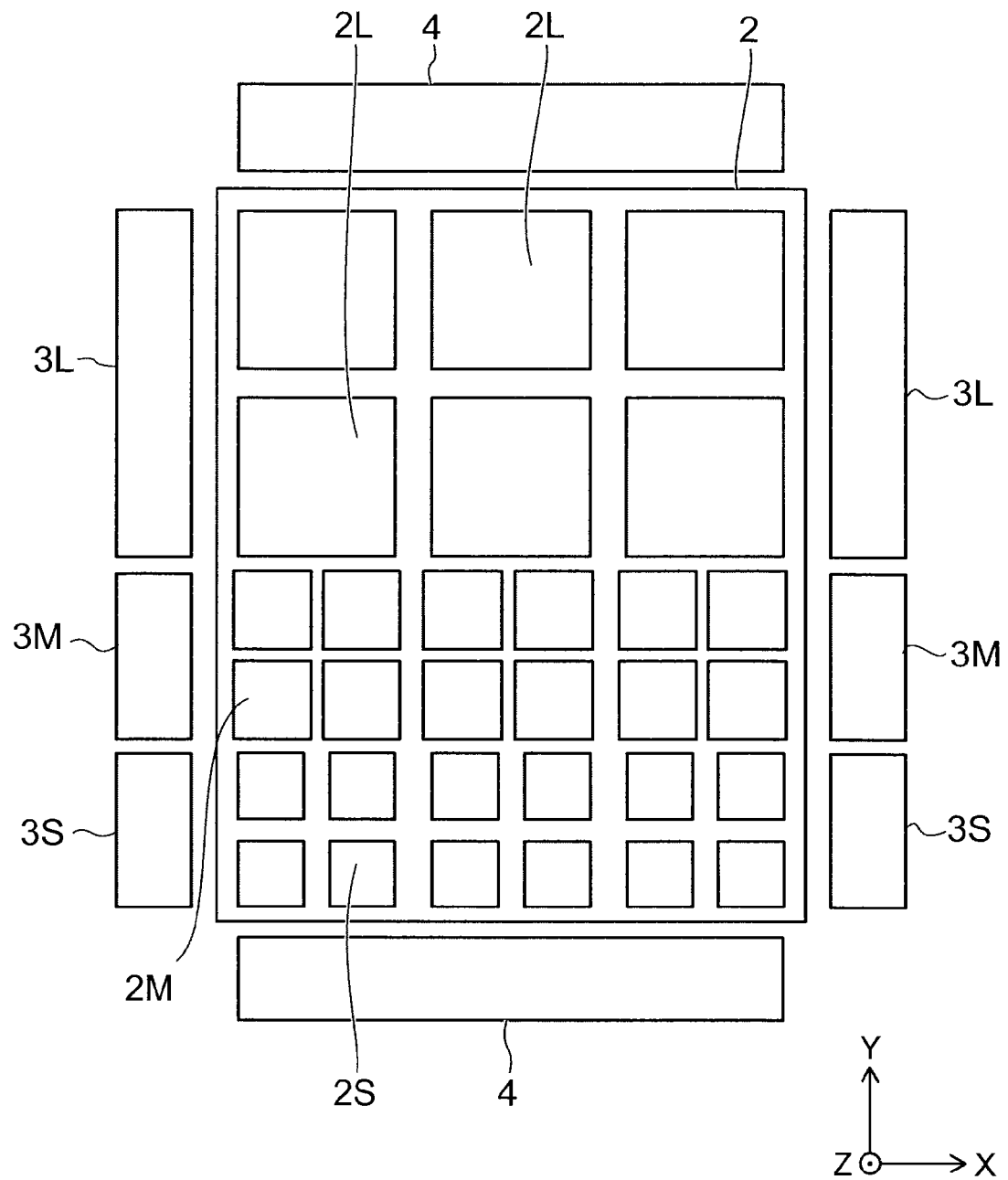

FIG. 11 shows a fifth arrangement example of the memory cell array of the non-volatile memory device according to the fourth embodiment.

The memory cell regions arranged in the memory cell array 2 are not limited to the first memory cell regions 2L and the second memory cell regions 2S. In the fifth arrangement example, third memory cell regions 2M are arranged in addition to the first memory cell regions 2L and the second memory cell regions 2S. The fifth arrangement example includes the word lines extending in the X-direction, the bit lines extending in the Y-direction, and third memory cell regions 2M provided between the word lines and the bit lines and being capable of changing the resistance state. The third memory cell region 2M is smaller in area than the first memory cell region 2L and larger in area than the second memory cell region 2S. For instance, the group of second memory cell regions 2S, the group of third memory cell regions 2M, and the group of first memory cell regions 2L are arranged in the Y-direction. Furthermore, the memory cell regions are not limited to three kinds, but may be four kinds or more.

Furthermore, in the fifth arrangement example, in the Y-direction, the group of second memory cell regions 2S, the group of third memory cell regions 2M, and the group of first memory cell regions 2L are sandwiched between the column control circuits 4. Furthermore, in the X-direction, a row control circuit 3L is arranged beside the group of first memory cell regions 2L. In the X-direction, a row control circuit 3M is arranged beside the group of third memory cell regions 2M. In the X-direction, a row control circuit 3S is arranged beside the group of second memory cell regions 2S. The column control circuit 4 is shared to control the first memory cell regions 2L, the third memory cell regions 2M, and the second memory cell regions 2S.

In the fifth arrangement example, the third memory cell regions 2M are arranged in addition to the first memory cell regions 2L and the second memory cell regions 2S. This increases the degree of freedom of the application of each memory cell region.

Figure 12:
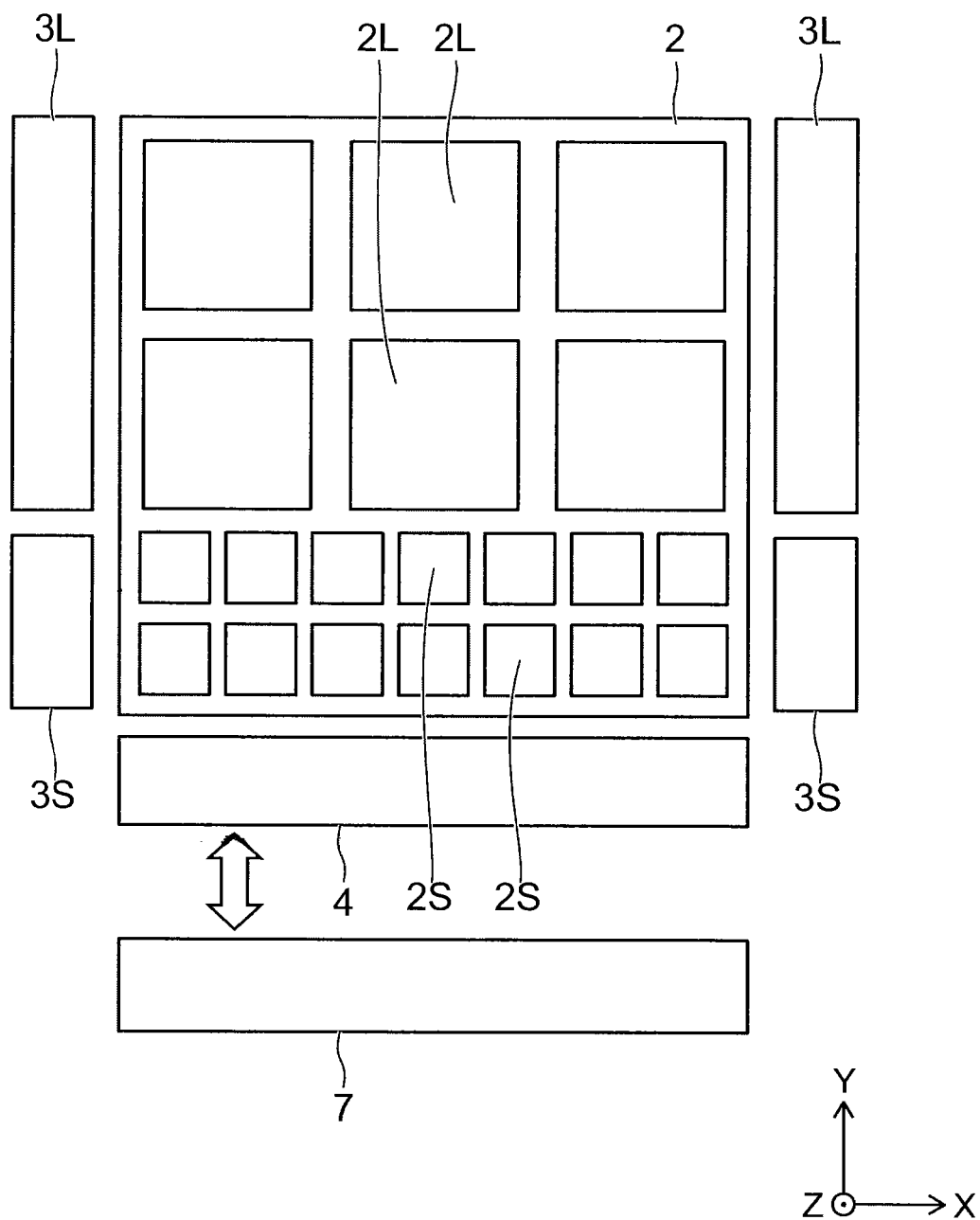

FIG. 12 shows a sixth arrangement example of the memory cell array of the non-volatile memory device according to the fourth embodiment.

In the sixth arrangement example, the memory cell array 2 includes the first memory cell regions 2L and the second memory cell region 2S. The control circuit 4 is arranged on only one side of this memory cell array 2. For instance, in the Y-direction, the column control circuit 4 is arranged on only the lower side of the figure. Furthermore, in the Y-direction, a data input/output buffer 7 is arranged beside the column control circuit 4. That is, the column control circuit 4 is arranged between the data input/output buffer 7 and the group of second memory cell regions 2S. The column control circuit 4 is shared to control the first memory cell regions 2L and the second memory cell regions 2S. Furthermore, in the X-direction, a row control circuit 3L is arranged beside the group of first memory cell regions 2L. In the X-direction, a row control circuit 3S is arranged beside the group of second memory cell regions 2S. The data input/output buffer 7 controls the first control circuit and the second control circuit. The group of the second memory cell regions 2S being adjacent is arranged between the data input/output buffer 7 and the group of the first memory cell regions 2L adjacently arranged therein.

In the sixth arrangement example, the data input/output buffer 7, the column control circuit 4, and the second memory cell regions 2S are arranged in this order in the Y-direction. Thus, the transfer distance of data is shortened. This improves the operation speed.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A non-volatile memory device comprising:
a first memory cell region including first wirings extending in a first direction, second wirings extending in a second direction crossing the first direction, the second wirings being adjacent to the first wirings in a third direction crossing the first direction and the second direction, and first memory cells being provided at first crossing portions, the first wirings and the second wirings crossing at the first crossing portions, one of the first memory cells electrically connecting to one of the first wirings and one of the second wirings at one of the first crossing portions, and including a first resistive layer;
a second memory cell region positioned beside the first memory cell region in a direction crossing the third direction, the second memory cell region including third wirings extending in the first direction, fourth wirings extending in the second direction, the third wirings being adjacent to the fourth wirings in the third direction, and second memory cells being provided at second crossing portions, the third wirings and the fourth wirings crossing at the second crossing portions, one of the second memory cells electrically connecting to one of the third wirings and one of the fourth wirings at one of the second crossing portions, and including a second resistive layer; and
a control circuit configured to independently control each of the first memory cell region and the second memory cell region by selecting one of the first wirings and one of the second wirings or selecting one of the third wirings and one of the fourth wirings,
a number of the second memory cells provided at the second crossing portions being smaller than a number of the first memory cells provided at the first crossing portions, and
the second memory cell region having a smaller area than the first memory cell region.

2. The device according to claim 1, wherein the control circuit includes a first control circuit and a second control circuit,
the first control circuit is configured to select one of the first wirings, select one of the second wirings, and select one of the first memory cells connected to the one of the first wiring and the one of the selected second wiring;
the second control circuit is configured to select one of the third wirings, select one of the fourth wirings, and select one of the second memory cells connected to the one of the selected third wiring and the one of the selected fourth wiring, and the first control circuit is configured to write in multiple values on the first memory cells, and the second control circuit is configured to write binary values on the second memory cells.

3. The device according to claim 1, wherein the control circuit includes a first control circuit and a second control circuit,
the first control circuit is configured to select one of the first wirings, select one of the second wirings, and select one of the first memory cells connected to the one of the selected first wiring and the one of the selected second wiring;
the second control circuit is configured to select one of the third wirings, select one of the fourth wirings, and select one of the second memory cells connected to the one of the selected third wiring and the one of the selected fourth wiring, and
the first control circuit is configured to write binary values on the first memory cells, and the second control circuit is configured to perform write multiple values on the second memory cells.

4. The device according to claim 1, wherein the control circuit includes a first control circuit and a second control circuit,
the first control circuit is configured to select one of the first wirings, select one of the second wirings, and select one of the first memory cells connected to the one of the selected first wiring and the one of the selected second wiring;
the second control circuit is configured to select one of the third wirings, select one of the fourth wirings, and select one of the second memory cells connected to the one of the selected third wiring and the one of the selected fourth wiring, and
the first control circuit is configured to apply a first voltage to the one of the first wiring and the second control circuit is configured to apply a second voltage different from the first voltage to the selected third wiring.

5. The device according to claim 1, wherein the control circuit includes a first control circuit and a second control circuit,
the first control circuit is configured to select one of the first wirings, select one of the second wirings, and select one of the first memory cells connected to the one of the selected first wiring and the one of the selected second wiring;
the second control circuit is configured to select one of the third wirings, select one of the fourth wirings, and select one of the second memory cells connected to the one of the selected third wiring and the one of the selected fourth wiring, and
the first control circuit is configured to apply a first voltage to the one of the second wiring and the second control circuit is configured to apply a second voltage different from the first voltage to the selected fourth wiring.

6. The device according to claim 1, wherein the control circuit includes a first control circuit and a second control circuit,
the first control circuit configured to select one of the first wirings, select one of the second wirings, and select one of the first memory cells connected to the one of the selected first wiring and the one of the selected second wiring;
the second control circuit configured to select one of the third wirings, select one of the fourth wirings, and select one of the second memory cells connected to the one of the selected third wiring and the one of the selected fourth wiring, and
a voltage applied to the second memory cell by the second control circuit is lower than a voltage applied to the first memory cell by the first control circuit.

7. The device according to claim 1, wherein plural ones of the first memory cell region are provided, a first group includes the first memory cell regions being adjacent, plural ones of the second memory cell region are provided, and the first group is surrounded with the second memory cell regions as viewed from the third direction.

8. The device according to claim 7, wherein plural ones of the first group are arranged, and the first groups are surrounded with the second memory cell regions as viewed from the third direction.

9. The device according to claim 1, wherein plural ones of the first memory cell region are provided, plural ones of the second memory cell region are provided, and the first memory cell regions are surrounded with the second memory cell regions as viewed from the third direction.

10. The device according to claim 1, wherein
plural ones of the first memory cell region are provided, and plural ones of the second memory cell region are provided,
a memory cell array includes the first memory cell regions and the second memory cell regions, and
a second group includes the second memory cell regions being adjacent, and the second group is arranged in an edge portion of the memory cell array as viewed from the third direction.

11. The device according to claim 1, wherein the control circuit further includes a third control circuit configured to control a first control circuit and a second control circuit,
the first control circuit is being configured to select one of the first wirings, select one of the second wirings, and select one of the first memory cells connected to the one of the selected first wiring and the one of the selected second wiring,
the second control circuit is capable of selecting one of the plurality of third wirings, selecting one of the plurality of fourth wirings, and selecting one of a plurality of the second memory cells connected to the selected third wiring and the selected fourth wiring,
plural ones of the first memory cell region are provided, and plural ones of the second memory cell region are provided,
a first group includes the first memory cell regions being adjacent,
a second group includes the second memory cell regions being adjacent, and
the second group is arranged between the third control circuit and the first group as viewed from the third direction.

12. The device according to claim 11, wherein
a memory cell array includes the first memory cell regions and the second memory cell regions, and
the third control circuit is arranged on both edges of the memory cell array as viewed from the third direction.

13. The device according to claim 11, wherein
a memory cell array includes the first memory cell regions and the second memory cell regions, and
the third control circuit is arranged on only one edge of the memory cell array as viewed from the third direction.

14. The device according to claim 1, further comprising:
a third memory cell region positioned beside the first memory cell region or the second memory cell region in a direction crossing the third direction, the third memory cell region including fifth wirings extending in the first direction, sixth wirings extending in the second direction, the sixth wirings being adjacent to the fifth wirings in the third direction, and third memory cells being provided at third crossing portions, the fifth wirings and the sixth wirings crossing at the third crossing portions, one of the third memory cells electrically connecting to one of the fifth wirings and one of the sixth wirings at one of the third crossing portions, and including a third resistive layer, the third memory cell region having a smaller area than the first memory cell region and a larger area than the second memory cell region as viewed from the third direction,
a number of the third memory cells provided at the third crossing portions being smaller than a number of the first memory cells provided at the first crossing portions and being larger than a number of the second memory cells provided at the second crossing portions.

15. The device according to claim 1, wherein the second memory cell region is used as a cache memory region.

16. The device according to claim 1, further comprising:
a first decoder circuit controlling one of the first wirings in the first memory cell region;
a second decoder circuit controlling one of the second wirings in the first memory cell region;
a third decoder circuit controlling one of the third wirings in the second memory cell region; and
a fourth decoder circuit controlling one of the fourth wirings in the second memory cell region.

17. The device according to claim 16, wherein each of first decoder circuit and the third decoder circuit has a data latch circuit.

18. The device according to claim 17, further comprising:
a data transfer path between the data latch circuits, where data is transferred via the data transfer path between the data latch circuits and not via the control circuit.

* * * * *